United States Patent [19]

Siebert

[11] Patent Number: 5,703,507
[45] Date of Patent: Dec. 30, 1997

US005703507A

[54] DEVICE FOR SWITCHING AMONG CLOCK SIGNALS ALLOCATED TO A PLURALITY OF USERS

[75] Inventor: Harry Siebert, Germering, Germany

[73] Assignee: Siemens Aktiengesellschaft, Munich, Germany

[21] Appl. No.: 618,809

[22] Filed: Mar. 20, 1996

[30] Foreign Application Priority Data

Mar. 24, 1995 [DE] Germany .................. 195 10 800.0

[51] Int. Cl.$^6$ .................. H03K 3/64; G06F 1/06
[52] U.S. Cl. .................. 327/99; 327/293; 327/298
[58] Field of Search .................. 327/99, 291, 293, 327/295, 298, 296; 331/49

[56] References Cited

U.S. PATENT DOCUMENTS

| | | | |
|---|---|---|---|
| 5,155,380 | 10/1992 | Hwang et al. | 327/99 |
| 5,483,185 | 1/1996 | Scirber et al. | 327/99 |

FOREIGN PATENT DOCUMENTS

| | | | |
|---|---|---|---|
| 59-221115 | 12/1984 | Japan | 327/99 |
| 4-126408 | 4/1992 | Japan | 327/99 |
| 5-268022 | 10/1993 | Japan | 327/99 |

OTHER PUBLICATIONS

"Method for Multiple Glitch–Free Clock Signal", IBM Technical Disclosure Bulletin, vol. 30, No. 10, Mar. 1988.
Wolfram Last, "Metasabiles Verhalten von Flipflops", Electronik 17, Aug. 18, 1989.

Primary Examiner—Timothy P. Callahan
Assistant Examiner—T. T. Lam
Attorney, Agent, or Firm—Hill, Steadman & Simpson

[57] ABSTRACT

Several users emit their own selection signal and clock signal to their respective selection circuits. The selection circuits send selection criteria to all other selection circuits and the clock switching stage. The selection circuit sends an activity signal to a digital circuit based on the allocated user's selection signal, the selection criteria of all the other selection circuits and the selected clock signal.

13 Claims, 2 Drawing Sheets

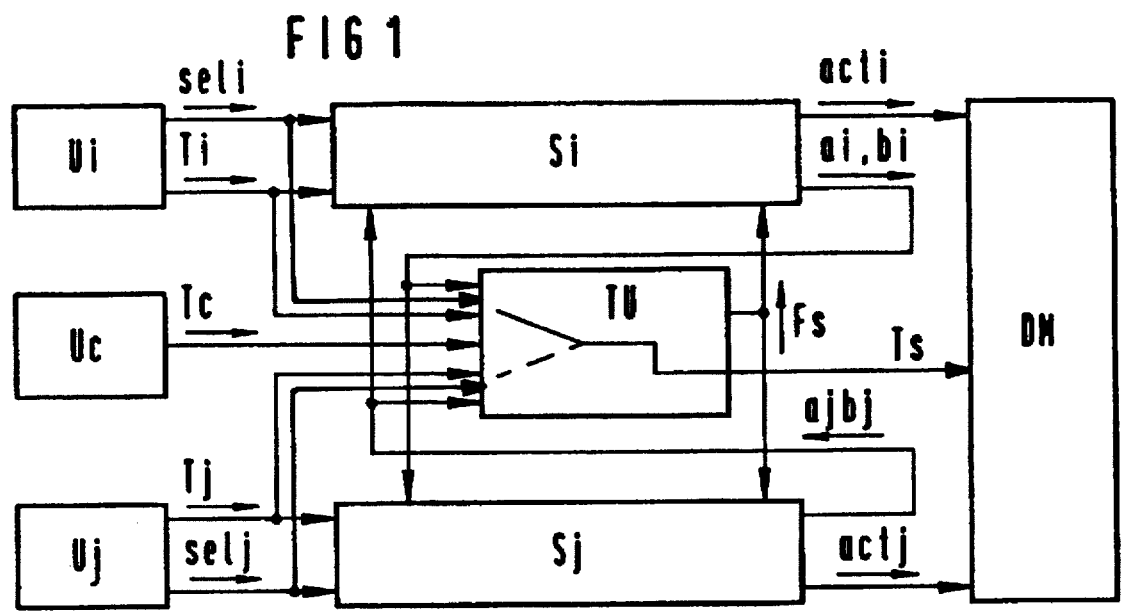
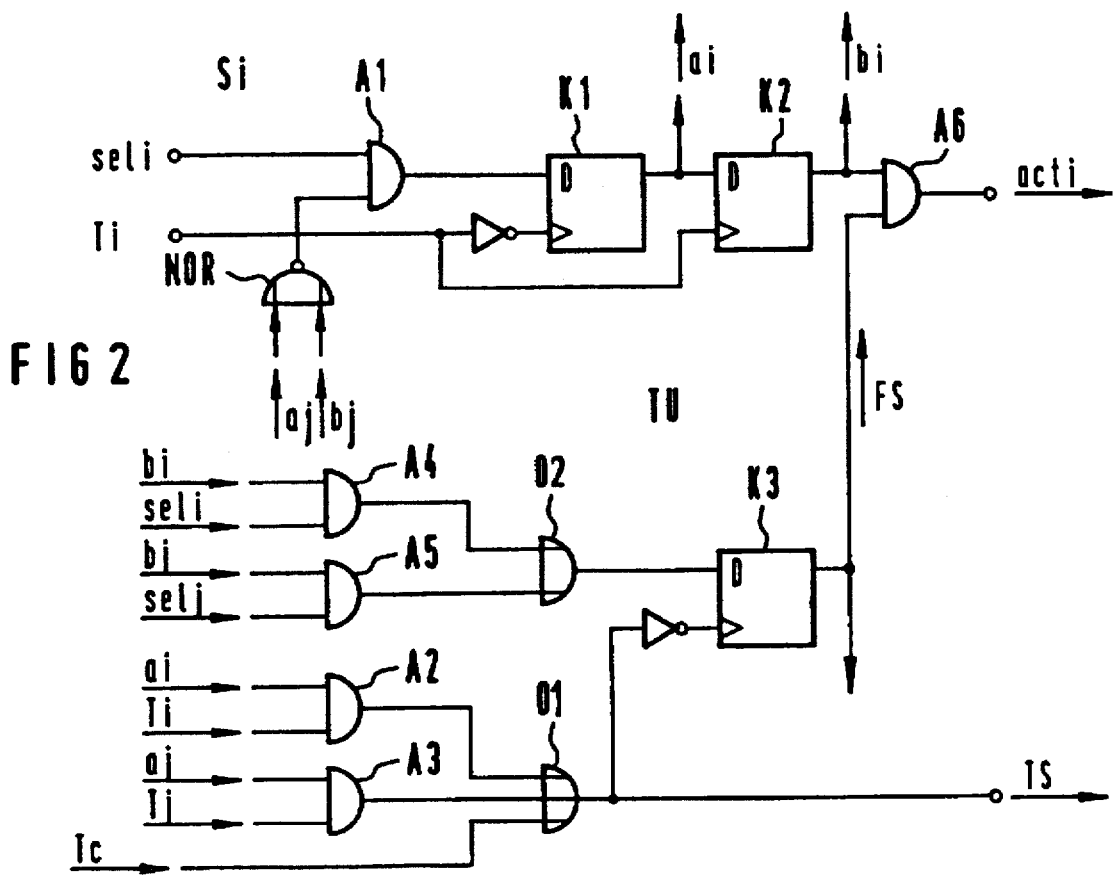

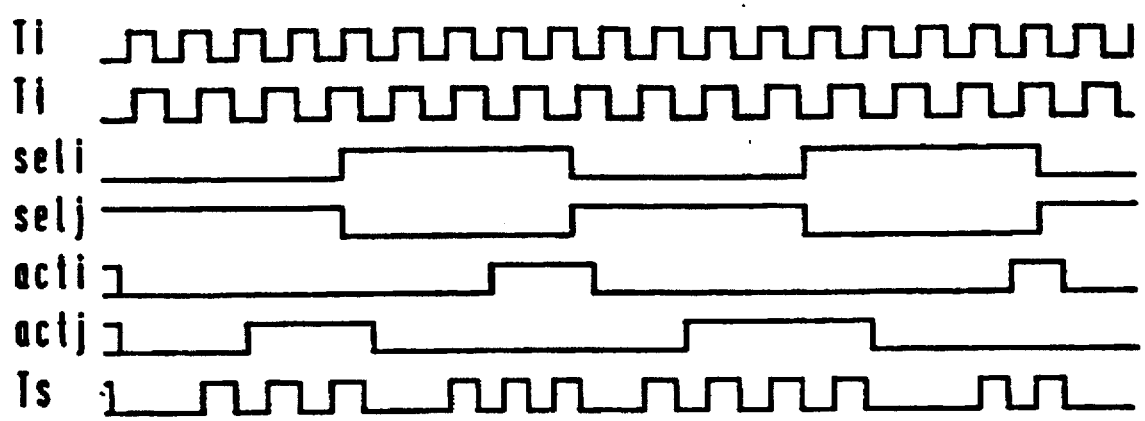
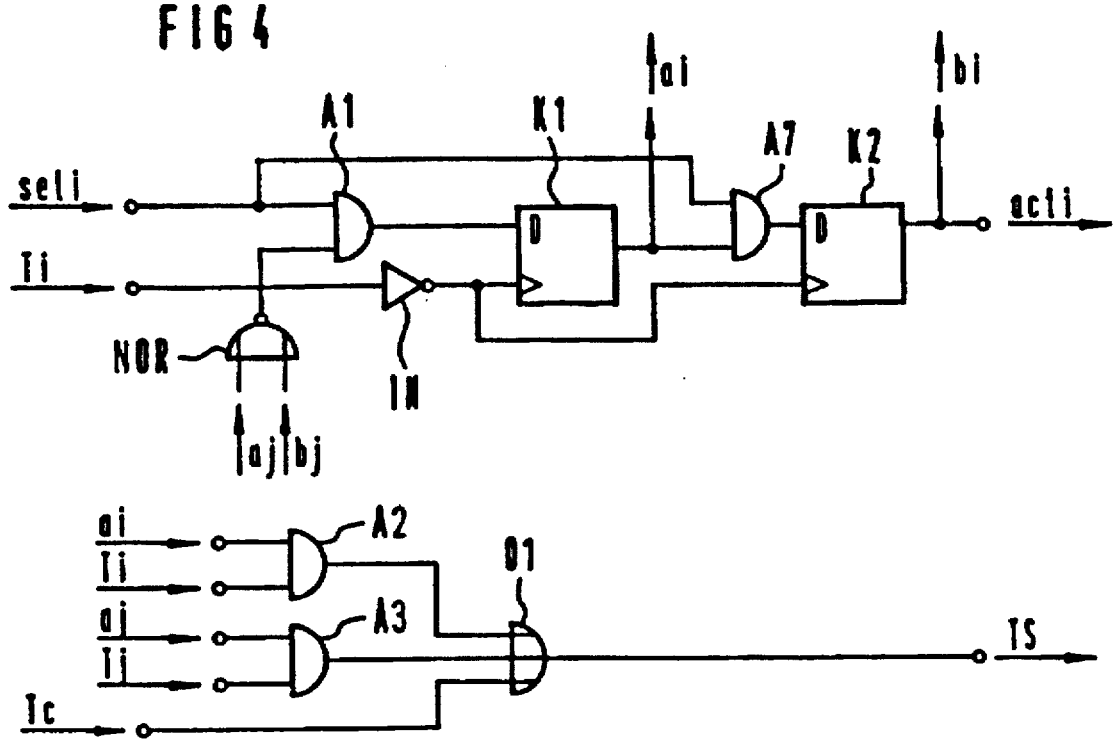

DEVICE FOR SWITCHING AMONG CLOCK SIGNALS ALLOCATED TO A PLURALITY OF USERS

BACKGROUND OF THE INVENTION

1. Field of the Invention

The invention is directed to a device for switching among clock signals respectively allocated to several users in order to feed a clock signal allocated to a selected user through to a clock-controlled digital circuit.

2. Description of the Prior Art

When multiple users access a digital circuit, such as a first-in, first-out memory, problems often arise during the switching phase between successive (alternating) clock signals. The switching to the other clock signal cannot take place until the previously effective clock signal is no longer present.

SUMMARY OF THE INVENTION

An object of the invention is to provide a simple device for switching among different clock signals, one of which is to be fed to a digital circuit. This object is achieved in a device in accordance with the principals of the present invention wherein each one of the multiple users emits its own selection signal and clock signal to its corresponding selection circuit. Each selection circuit emits selection criteria that is communicated to all the other selection circuits and the clock switching stage.

Based on the selection signal of a selected user and the selection criteria sent from all the other selection circuits, the corresponding selection circuit sends an activity signal to the digital circuit. The clock switching stage switches one selected clock signal emitted by the user, simultaneously with the activity signal.

A particular advantage of this device is that it can be implemented using only a few logical switching elements. By means of the delayed output of an activity signal, the digital circuit can also receive additional clock pulses in order to carry out required working steps internally.

BRIEF DESCRIPTION OF THE DRAWINGS

FIG. 1 is a block diagram of the preferred embodiment with two users.

FIG. 2 is a detailed schematic diagram of a selection circuit and a clock switching stage of the embodiment.

FIG. 3 is a timing diagram with a horizontal time axis.

FIG. 4 is a schematic diagram of an alternative embodiment.

DETAILED DESCRIPTION OF THE PREFERRED EMBODIMENTS

In FIG. 1 two users Ui and Uj are schematically shown, these being representative of many users. Each user Ui, Uj signals an access request to a digital circuit DM. Generally, the digital circuit DM is a digital memory or an arithmetic-logic unit using a selection signal seli or selj. The clocks Ti, Tj respectively allocated to users Ui, Uj (with which the selection signals do not have to be synchronous) are supplied to a clock switching stage TU, at whose output a selected clock signal Ts is emitted and fed to the digital circuit DM. In the selection circuits Si and Sj, activation signals acti and actj are generated. The activation signals acti, actj can set various operational modes of the digital circuit DM. If the digital circuit DM has only one activation input, the activation signals acti, actj can be connected with one another through an OR-operation. For problem-free operation it is essential that each selection circuit Si and Sj is informed of the access requests of the other selection circuits. Its selection signal seli or selj should be effective only if permitted by the other selection circuits.

Activity signals acti, actj can also be simulated by a test unit Uc. Here, a test clock signal Tc can be switched through the clock switching stage TU.

FIG. 2 shows a detailed representation of a selection circuit Si and the clock switching stage TU. All selection circuits Si, Sj are of similar construction. Selection criteria aj and bj are fed to the selection circuit Si from all the other selection circuits via a NOR gate (whose input number must be increased if there are more than two users). The selection criteria aj, bj combined with the selection signal seli of the allocated user Ui are sent to the data input D of a first flip-flop K1 via a first AND gate A1. A second flip-flop K2 is connected in series with the flip-flop K1. The flip-flops K1 and K2 are controlled by different edges of the clock signal Ti. In the first flip-flop K1 the negative edge of the clock signal Ti is effective. The negative edge of the clock signal Ti is fed to the clock input of the first flip-flop K1 via an inverter IN. In the second flip-flop K2, the positive edge of the clock signal Ti is effective.

If the selection criteria of the other selection circuits (here only the selection circuit Sj) signal that no selection signal is present, i.e. that all the inputs of the NOR gate are at the logical zero, then its own selection signal seli is connected through the first AND gate A1 to the D input of the first flip-flop K1, and blocks other selection signals that may possibly already be present from other users as a sampled selection criterion ai, e.g. following the negative edge of the allocated clock signal Ti.

By means of the second flip-flop K2, a delayed selection criterion bi free of metastable states is obtained. This is not relayed directly to the digital circuit DM as an activation signal acti but rather is carried via a sixth AND gate A6. The control (determination) of the output signal of the first flip-flop K1 with the next (positive) edge of the clock signal Ti is advantageous because the delay time is reduced significantly.

If the same edges (e.g. the positive ones) of the clock signal Ti, in the digital circuit DM, are effective in the second flip-flop K2, then the activation signal acti should be emitted with a negative edge. This occurs by means of an enable signal FS of the clock switching stage TU.

The clock switching stage TU contains a first AND-OR stage formed by gates A2, A3, O1 for switching between the clock signals Ti, Tj allocated to the users Ui, Uj, and a second AND-OR stage formed by gates A4, A5, O2 for the generation of a delayed enable signal FS. The clock switching occurs by AND logic gates A2 and A3. The sampled selection criteria ai or aj and the associated clock signal Ti or Tj are fed, through a first OR gate O1, that connects through one of the allocated clock signals as a working clock signal TS. If the first flip-flop K1, which generates the selection criterion ai, is connected through with the negative edge of the clock signal Ti, the next positive impulse of the working clock signal TS is already effective for the control of the digital circuit DM.

At the inputs to the second AND-OR stage formed by gates A4, A5, O2, a delayed selection criterion bi and bj is combined with a selection signal seli or selj. The output of the second OR logic gate O2 is connected to the data input D of a third flip-flop K3. If selection signals seli, selj and selection criteria ai, bi are present and correspond to one another (e.g. seli and ai) then the third flip-flop K3, which emits the enable signal FS, is set with the following negative pulse edge of the selected working clock signal Ts.

The delayed selection criterion is not emitted via the sixth AND gate A6 as an activity signal acti until the third flip-flop K3 is set.

As soon as the selection signal seli disappears, the activity signal acti is already inhibited with the next negative edge of the working clock signal Ts. The timing diagram in FIG. 3 shows the operation of the device for two users under particularly critical switching conditions. The activation signals acti, actj switch between writing and reading in a memory. Before every activation signal acti, actj, an additional impulse of the newly through-connected working clock signal TS is generated. This impulse serves for the required resetting of the digital circuit. If several of these additional impulses should be required, in place of the third flip-flop K3 several flip-flops can also be used for a longer delay. The additional impulse can be suppressed by a gate corresponding to A5.

In FIG. 4, an alternative embodiment is shown in which the function of the AND-OR stage formed by gates A4, A5, O2 and the third flip-flop K3 is performed by a seventh AND gate A7. In this embodiment, this portion of the overall functioning of the switching stage can be performed in each selection circuit. To this end, the AND gate A7 is inserted between the output of the first flip-flop K1 and the data input D of the second flip-flop K2. The selection signal seli is fed to the second input of the AND gate A7. The same inverted clock signal Ti is fed to both flip-flops K1, K2. This circuit is particularly advantageous if only one additional impulse is required. It operates in the same way as the circuit represented in FIG. 2.

Although modifications and changes may be suggested by those skilled in the art, it is the intention of the inventors to embody within the patent warranted hereon all changes and modifications as reasonably and properly come within the scope of their contribution to the art.

I claim as my invention:

1. A switching arrangement for selecting a clock signal for a digital circuit, said switching arrangement having a plurality of users, each user emitting a selection signal, indicating selection of that user, and a clock signal, said switching arrangement comprising:

a plurality of selection circuits equal in number and respectively allocated to said users, each selection circuit having a first input supplied with the selection signal of its allocated user, a second input supplied with the clock signal of its allocated user, a third input, and first and second outputs;

each selection circuit further including means for producing a sampled selection criterion and means for producing a delayed selection criterion derived from said sampled selection criterion, said sampled selection criterion and said delayed selection criterion comprising selection criteria and being present at said first output and an activity signal being present at said second output;

means for providing said activity signal at said second output from said delayed selection criterion;

the third input of each selection circuit being connected to the first output of each of the other selection circuits;

each selection circuit further including means for enabling production of said selection criteria only in the presence of the selection signal from its allocated user and the absence of any selection criteria at its third input;

the digital circuit connected to the second outputs of all of said selection circuits and being supplied with the activity signal from the selection circuit allocated to a selected user; and clock switching means, having a first set of inputs connected to said users and receiving the respective clock signals therefrom and a second set of inputs connected to the first outputs of said selection circuits for receiving said selection criteria therefrom, for switching one clock signal, emitted by a user which has emitted a selection signal, through as a selected clock signal to said digital circuit dependent on said selection criteria.

2. The arrangement according to claim 1, wherein the means for producing the sampled selection criterion comprise a flip-flop.

3. The arrangement according to claim 1, wherein the means for producing the delayed selection criterion comprise a flip-flop.

4. The arrangement according to claim 1, wherein the means for producing the sampled selection criterion and the means for producing the delayed selection criterion comprise:

a first flip-flop having a data input supplied with said selection signal from said means for enabling, and an output;

a second flip-flop having a data input connected to the output of the first flip-flop, said first flip-flop being triggered by a first edge of the clock signal and said second flip-flop being triggered by a second edge of the clock signal.

5. The arrangement according to claim 1, wherein the means for producing the sampled selection criterion and the means for producing the delayed selection criterion comprise:

a first flip-flop having a data input supplied with said selection signal from said means for enabling, and an output;

a second flip-flop having a data input connected to the output of the first flip-flop; and wherein said means for enabling comprises an AND logic gate having a first input supplied with said selection signal, a second input coupled to the third input of the selection circuit, and an output connected to the data input of the first flip-flop, said first and second flip-flops both being triggered by an edge of the clock signal.

6. The arrangement according to claim 1, wherein the means for enabling production of said selection criteria further comprise:

a NOR logic gate connected to said third input of the selection circuit and having an output; and an AND logic gate having one input supplied with the selection signal, a second input connected to the output of the NOR logic gate, and an output connected to said means for producing the sampled selection criterion.

7. The arrangement according to claim 1, wherein the clock switching means comprises:

a flip-flop stage having a data input and a clock input and an output;

a first logic network having a plurality of inputs for accepting the selection signals and delayed selection criterion of the plurality of selection circuits and having an output connected to the data input of the flip-flop stage producing an enable signal; and a second logic network having a plurality of inputs for accepting sampled selection criteria of the plurality of selection circuits and the clock signals connected to the clock input of the flip-flop stage and producing said selected clock signal.

8. The arrangement according to claim 7, the first logic network further comprising:
   an OR logic gate having a plurality of inputs and an output connected to the data input of the flip-flop stage; and
   a plurality of AND logic gates respectively allocated to said users and said delayed selection criterion and having a plurality of outputs connected to the plurality of inputs of the OR logic gate.

9. The arrangement according to claim 7, the second logic network further comprising:
   an OR logic gate having a plurality of inputs and an output emitting the selected clock signal;
   a plurality of AND logic gates respectively allocated to said clock signals and said sampled selection criterion and having a plurality of outputs connected to the plurality of inputs of the OR logic gate;
   a test clock signal connected to the input of the OR logic gate; and
   an inverter tapping off the output of the OR logic gate connected to the clock input of the flip-flop stage.

10. The arrangement according to claim 7, wherein the flip-flop stage is a single flip-flop.

11. The arrangement according to claim 1, wherein the digital circuit is a memory unit and at least one activity signal selects a writing operation or a reading operation.

12. The arrangement according to claim 1 wherein the digital circuit is an arithmetic-logical unit.

13. The circuit arrangement according to claim 1, wherein the means for providing said activity signal at said second output from said delayed selection criterion further comprises:
   a logical AND gate having a first input connected to the delayed selection criterion and a second input connected to an enabling signal and producing the activity signal at an output.

\* \* \* \* \*